United States Patent [19]

Inagaki et al.

[11] Patent Number: 4,777,641
[45] Date of Patent: Oct. 11, 1988

[54] METHOD AND APPARATUS FOR ALIGNMENT

[75] Inventors: Akira Inagaki; Yukio Kembo; Ryuichi Funatsu, all of Yokohama; Asahiro Kuni, Tokyo; Keiichi Okamoto; Yoshihiro Komeyama, both of Yokohama, all of Japan

[73] Assignee: Hitachi, Ltd., Tokyo, Japan

[21] Appl. No.: 918,004

[22] Filed: Oct. 14, 1986

[30] Foreign Application Priority Data

Oct. 14, 1985 [JP] Japan ................... 60-226999

[51] Int. Cl.$^4$ .............................. G21K 5/00
[52] U.S. Cl. ...................... 378/34; 378/205; 250/491.1
[58] Field of Search .............. 378/34, 205, 206; 250/491.1, 492.1; 356/401

[56] References Cited

U.S. PATENT DOCUMENTS 4,127,777 11/1978 Binder.
4,203,123 5/1980 Schmitt et al.
4,326,805 4/1982 Feldman et al.

FOREIGN PATENT DOCUMENTS 0107820 5/1984 European Pat. Off.
2723902 11/1978 Fed. Rep. of Germany.
2803653 8/1979 Fed. Rep. of Germany.
2822269 11/1979 Fed. Rep. of Germany.

*Primary Examiner*—Janice A. Howell
*Assistant Examiner*—David P. Porta
*Attorney, Agent, or Firm*—Antonelli, Terry & Wands

[57] ABSTRACT

A method and apparatus for alignment for use in X-ray exposure or the like wherein a mask is provided having a formation of an alignment pattern made up of at least one linear segment formed in a peripheral section of the mask and a wafer is provided having a formation of an alignment pattern formed in a same direction as the alignment pattern of the mask and made up of linear segments. An illuminating arrangement illuminates a light to the mask alignment pattern along a direction inclined to the alignment direction and the mask alignment pattern and the wafer alignment pattern are imaged and transformed into a video signal. An A/D converts the video signal into a digital signal and stores the digital signal in a memory. The digital video signal is read out from the memory and averaged in a mask alignment pattern by removing a shadow portion caused by the mask alignment pattern and additionally averaged in a wafer alignment pattern area with an averaged wafer alignment pattern signal and an averaged wafer alignment pattern signal being provided. Relative displacement between the mask and the wafer is detected from the averaged mask alignment pattern signal and the averaged wafer alignment pattern signal and the mask and wafer are aligned by moving at least one of the mask and wafer so that displacement between the mask and the wafer does not exist.

5 Claims, 15 Drawing Sheets

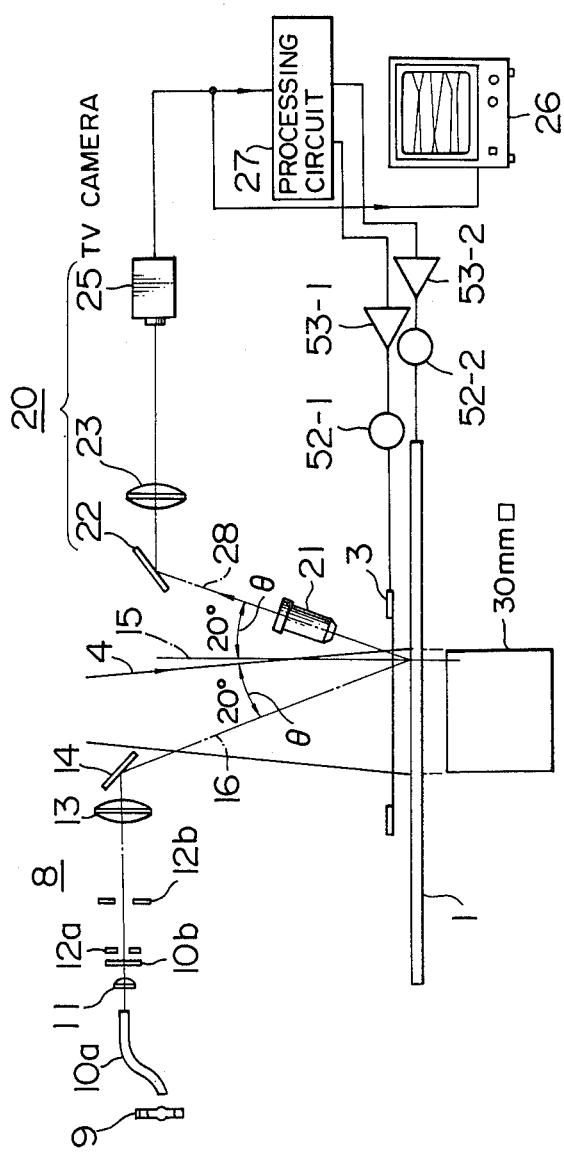
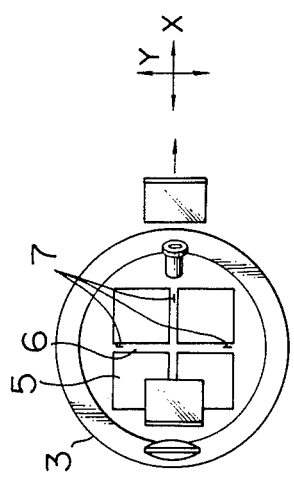
FIG. IA
FIG. IB $$Z_i(x_i) = \sum_{j=1}^{m} \{y(x_i-j) - y(x_i+j)\}^2$$

FIG. 12A
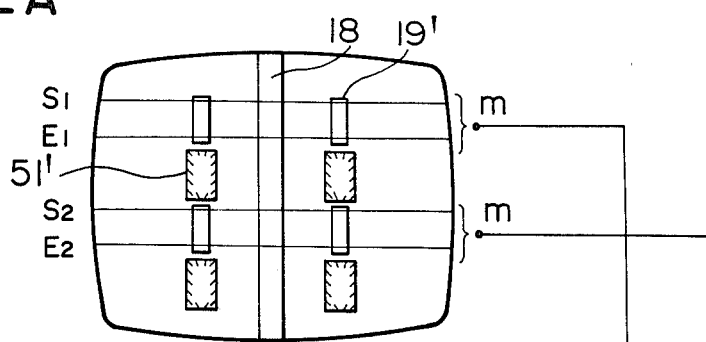
FIG. 12B
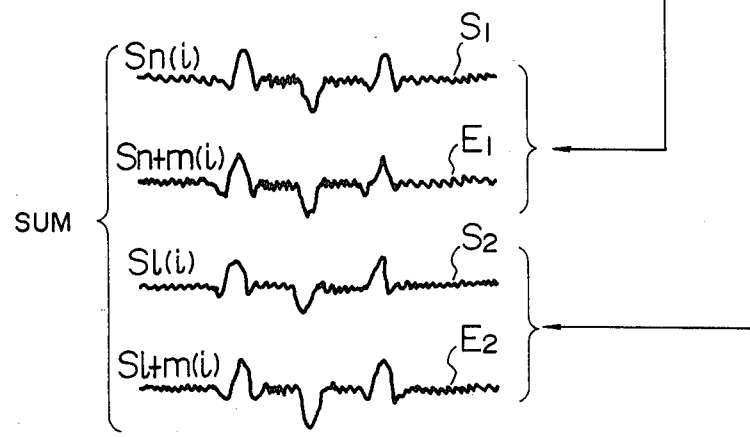
FIG. 12C
AVERAGE
$$\frac{\sum_{j=1}^{m} S_{n+j}(i) + \sum_{j=1}^{m} S_{l+j}(i)}{2m}$$
FIG. 12D
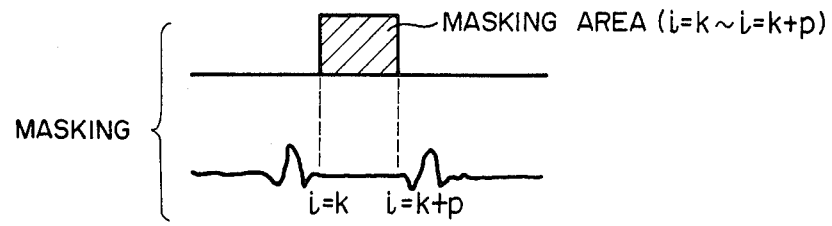

METHOD AND APPARATUS FOR ALIGNMENT

BACKGROUND OF THE INVENTION

This invention relates to a method and apparatus for aligning a plurality of objects, e.g., a wafer and mask, overlapping closely each other by measuring the relative displacement of the objects, and the invention particularly relates to a method and apparatus for alignment suitable for a proximity aligner system such as an X-ray exposure system in order to expose both the mask and the wafer.

Conventionally, relative positioning between the mask and wafer has been carried out by detecting positioning marks using a microscope, as described in Japanese Patent Publication No. 57-42971 or U.S. patent application Ser. No. 580,709 (EPC 841056). However, in this system, where the objective lens of the microscope is located upright over the plane of the mask and wafer, when it is intended to transfer a circuit pattern from the mask to the wafer by the X-ray exposure system described in U.S. Pat. No. 4,403,336, for example, the optical system for mark detection interferes with the exposure light, e.g., X-ray. Therefore, it is necessary for the microscope to have its objective lens kept out of the exposing optical system, and this time consuming operation results in a deteriorated throughput. For example, among latest LSI devices which are going to have a line width of smaller than 1 $\mu$m, the X-ray aligner which is a typical proximity aligner is intended to deal with a line width smaller than 0.8 $\mu$m. On this account, the alignment accuracy as fine as 0.3 $\mu$m is now required.

Methods of alignment detection include magnification of the alignment pattern, scanning of the alignment pattern using a laser beam and alignment method using a diffraction grating. The first-mentioned method is that alignment patterns of the mask and wafer are magnified by the objective lens and focused on the imaging element, the relative displacement of both patterns is evaluated through the signal processing, and the wafer is moved relative to the mask so that the relative displacement does not exist. The above-mentioned 0.3 $\mu$m alignment accuracy includes the mechanical error of the aligner and the dimensional error of the mask and wafer, and therefore the pure alignment accuracy required is as high as 0.1 $\mu$m.

To cope with this matter, there has been proposed an alignment method, as described in Japanese Patent Publication No. 57-42971 (1982) for example, in which an objective lens with a smaller focal depth is used to obtain a larger lens aperture so that a circuit pattern with a poor contrast can be imaged using much amount of light. In this case, however, the lens needs to have a magnification of 40 to 60 and an NA of 0.5 or more, as well as a larger aperture and smaller operating distance, and therefore there is a possibility of interference of the objective lens with the exposing X-ray when the alignment pattern is located within the exposure area. This has necessitated the retraction of the objective lens set at each exposure, which has impaired the throughput and disallowed the alignment detection concurrently with exposure.

In the conventional mask-wafer positioning method and apparatus, the fresnel zone marks made on the mask and wafer are illuminated oblique from outside of the exposure area into the exposure area so that the coherent light diffracted in the fresnel zone focuses in the exposure area, and therefore the objective lens for detecting the focal position must be located in the exposure area. Accordingly, the focal point in the fresnel zone is detected by the objective lens and, after alignment of the wafer to the mask, the objective lens must be retracted. The conventional exposing method has employed a single exposing operation for the entire surface of a wafer, and a slight overhead time has not been a serious matter. A positioning method of this category is disclosed in U.S. patent application Ser. No. 139,544.

In the case of the step-and-repeat method which is intended to transfer a fine pattern with less than 1 $\mu$m line width, the alignment and exposing operations are repeated more than ten times for each wafer, and the reduction of the alignment time is an urgent request. An associated problem is the deterioration of the mask-wafer alignment accuracy due to the vibration when the objective lens is moved following each mask-wafer alignment operation.

SUMMARY OF THE INVENTION

An object of this invention is to provide a method and apparatus for alignment, in which the objective lens of a microscope for viewing a mask and wafer does not interfere with the exposure light, e.g., X-ray, so that the microscope objective lens does not need to retract, thereby improving the throughput, and the position of the mask and wafer can be detected during exposure, and moreover the alignment mark on the mask is detected accurately, whereby accurate alignment can be accomplished.

In order to achieve the above objective, the inventive apparatus is arranged to have its microscope objective lens inclined with respect to the normal of the detection plane, i.e., the mask plane or wafer plane, so that the lens does not interfere with the exposure light, e.g., X-ray, thereby allowing the image transfer while detecting the relative position between the mask and wafer, and is provided with a mask alignment pattern which is formed of a pluraliry of linear segments oriented in one direction so that the mask alignment pattern without the shadow can be made longer, and is adapted to receive image signals across the linear segments, thereby improving the accuracy of positional detection of the mask alignment pattern, whereby as a result the mask-wafer alignment accuracy is upgraded.

With the microscope objective lens being arranged oblique with respect to the normal of the detection plane, i.e., the mask plane or wafer plane, as metioned above, the detection plane of the microscope objective lens is not perpendicular to the detection optical axis, and therefore when it is detected by the microscope objective lens, the imaging plane becomes more oblique against the optical axis. On tiis account, even if the optical sensor for positional detection is placed at right angles with the optical axis, the in-focus portion is only a fraction of the whole and sufficient positional information cannot be obtained. To cope with this matter, a diffraction grating having a grating face in a certain shape is disposed virtually in coincidence with the imaging plane which is oblique with respect to the optical axis. When the light reflected virtually in perpendicular to the diffraction grating face is focused again by the objective lens of a second microscope, the imaging plane intersects the optical axis virtually at right angles. By placing the optical sensor on the imaging plane, the positions of the mask and wafer are detected.

Another feature of this invention is that an objective lens with small NA is used to make up a magnification optical system. Since an objective lens with small NA has a longer operating distance and a deeper focal depth, it becomes possible to detect the alignment pattern in an oblique arrangement so that is does not interfer with the exposure light even in detecting a pattern in the exposure area or its periphery. However, positional detection is in only one direction for an optical axis (the direction at right angles with the detection optical axis on the wafer or mask plane), and therefore three optical axes are required for three-dimensional detection (X, Y, $\theta$) for example.

With the illumination light incident at right angles with the mask alignment plane, its shadow overlaps right on the entire mask alignment pattern, but when the illumination light is incident at a certain inclination angle with the plane normal to the mask alignment plane, a displacement of the shadow occurs in the reflection direction seen from the incident direction from the alignment pattern. In this invention, the mask alignment pattern is formed of a plurality of linear segments oriented in one direction so that the pattern without the shadow can be made longer and the image signals across the linear segment are received, with the intention of improving the accuracy of positional detection of the mask alignment pattern.

BRIEF DESCRIPTION OF THE DRAWINGS

FIG. 1A is a front view showing in brief the mask alignment apparatus embodying this invention;

FIG. 1B is a plan view of the apparatus shown in FIG. 1A;

FIG. 12A is a diagram showing the relationship between the mask alignment, the shadow image and the pick-up position according to this invention;

FIG. 12B is a diagram explaining the summation of the signals;

FIG. 12C is a diagram explaining the average signal;

FIG. 12D is a diagram explaining the extraction of the mask alignment pattern signal by masking;

DESCRIPTION OF THE PREFERRED EMBODIMENTS

Figure 2A:
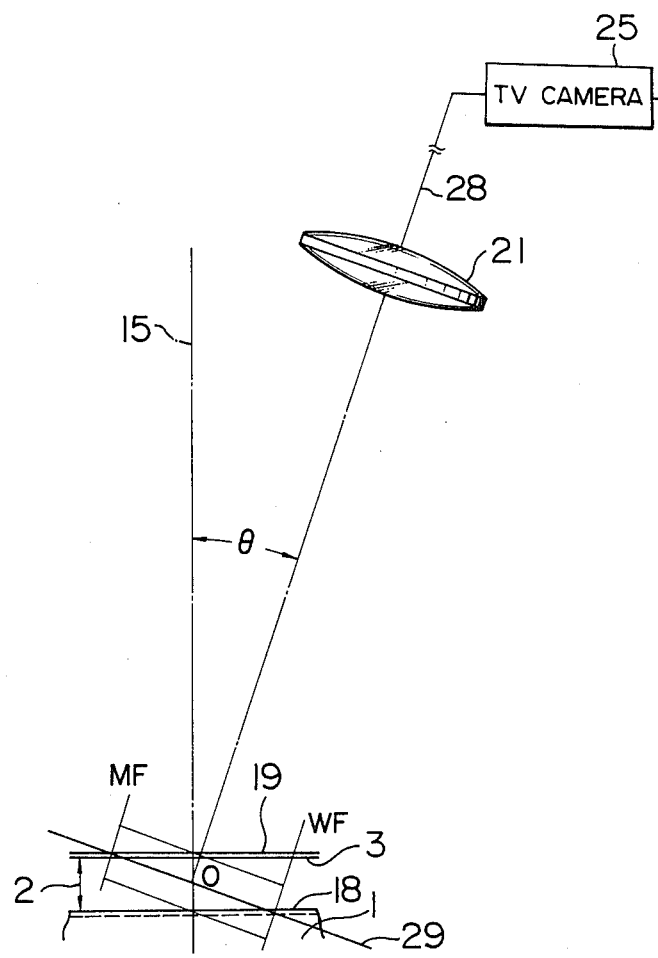
FIG. 2A is a cross-sectional view of a portion of detection on the wafer alignment pattern and mask alignment pattern.

Embodiments of this invention will now be described with reference to the drawings. FIG. 1A is a front view showing in brief the arrangement of the inventive mask alignment apparatus, and FIG. 1B is a plan view pertinent to FIG. 1A.

In the figures, a wafer 1 has a formation of a wafer pattern (not shown) on its upper surface. A mask 3 is made of a transparent sheet and disposed in parallel to the wafer 1 with a spacing of 10-15 $\mu$m. The mask 3 has on its upper surface a formation of three alignment patterns 7 on streets 6 within a chip 5, and has on its lower surface a formation of a mask pattern (not shown) in location coincident with the wafer pattern. An exposure X-ray beam 4 is emitted from an X-ray source (not shown) located above the mask 3, and it is intended to project the mask pattern on to an area of 30 mm square, for example, on the wafer 1. Reference number 8 generally denotes three sets of illumination optical systems (only one set is shown in the figure), and each system operates such that the white illumination light produced by a light source 9 is conducted through a fiber 10a, lens 11, filter 10b, diaphragms 12a and 12b, and a lens 13 to a mirror 14, which is disposed outside the field of the exposure X-ray beam 4 so that the illumination light beam irradiates the wafer alignment pattern and mask alignment pattern along the illumination optical axis 16 that inclines by about 20° with respect to the plane at right angles with the alignment direction (Y direction), i.e., with respect to the normal 15.

Figure 2B:
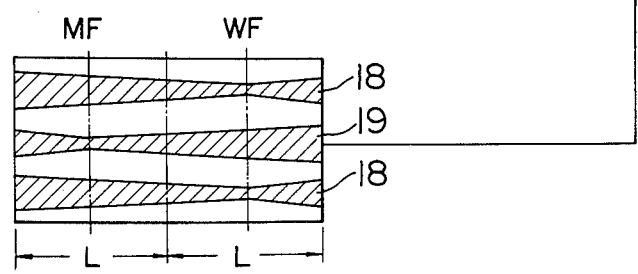
FIG. 2B is a diagram showing detected images of the wafer alignment pattern and mask alignment pattern.

Reference number 20 generally denotes three sets of detection optical systems (only one set is shown in the figure), and each system consists of an objective lens 21, a mirror 22, a focusing lens 23, a TV camera 25, a monitor TV set 26, and a processing circuit 27. The objective lens 21 is disposed on the detection optical axis 28 which inclines by the same angle $\theta = 20°$ as for the illumination optical axis 16 with respect to the normal 15 and in location outside the field of the exposure X-ray beam 4. As shown in FIG. 2A for the cross-section of the detecting portion of the wafer alignment pattern 18 of the wafer 1 and the mask alignment pattern 19 of the mask 3, when a plane at right angles with the detection optical axis 28 passing through the center 0 of the wafer alignment pattern 18 and mask alignment pattern 19 on the normal 15 is assumed to be an imaginative focal plane 29, intersections MF and WF of the imaginative focal plane 29 with the mask alignment pattern 19 and wafer alignment pattern 18 have distance therebetween defining a focal range L, and as shown in FIG. 2B the image displayed on the monitor TV screen 25 is such that the mask pattern 19 at a latelally center position is best in-focus at the left-hand intersection MF and the pattern goes out of focus as the position moves to both longitudinal directions, while two wafer patterns 18 on both sides of the central mask pattern 19 is best in-focus at the right-hand intersection WF and the pattern goes out of focus as the position moves to both longitudinal directions. The range L between the intersections MF and WF is calculated to be 26.3 μm in terms of the view field based on the result of Table 1. The availability of such a large in-focus range L owes to the smaller NA of the objective lens 21.

According to the Rayleigh's formulas, the performance of the objective lens is given as functions of NA as follows.

$$\text{Resolution: } R = 0.61 \cdot \lambda \cdot \frac{1}{NA^2} - 1 \quad (1)$$

$$\text{Focal depth: } |Z| \leq \frac{\lambda}{2}\left(\frac{1}{NA^2} - 1\right) \quad (2)$$

where λ is the wavelength of the light used. As indicated, the smaller the NA, the larger is the operating distance. The following Table 1 is the result of calculation of the above equations (1) and (2) for NA taking values 0.25 and 0.5.

TABLE 1

| NA | Resolution | Focal depth | Operating distance |
|---|---|---|---|
| 0.25 | 0.6 μm | ±4.5 μm | 20 mm |
| 0.5 | 1.4 μm | ±0.9 μm | 5 mm |
| | | | (λ = 0.6 μm) |

As will be appreciated from Table 1 and equations (1) and (2), design factors such as the focal depth and operating distance are improved significantly although the resolution falls. Based on the above examination, the present invention employs an objective lens with smaller NA in the magnification optical system.

Figure 3:
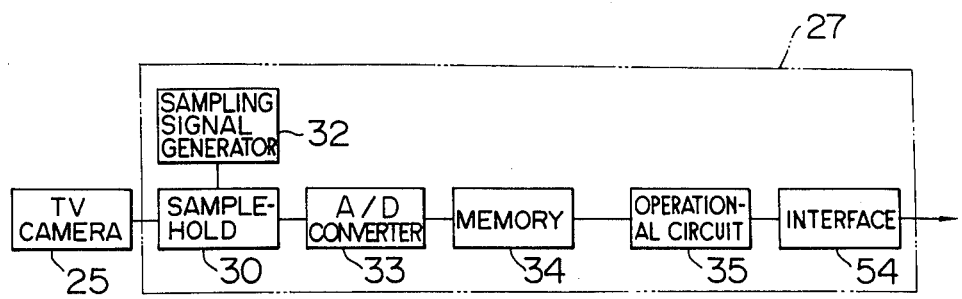
FIG. 3 is a block diagram of the processing circuit shown in FIG. 1A.
Figure 4:
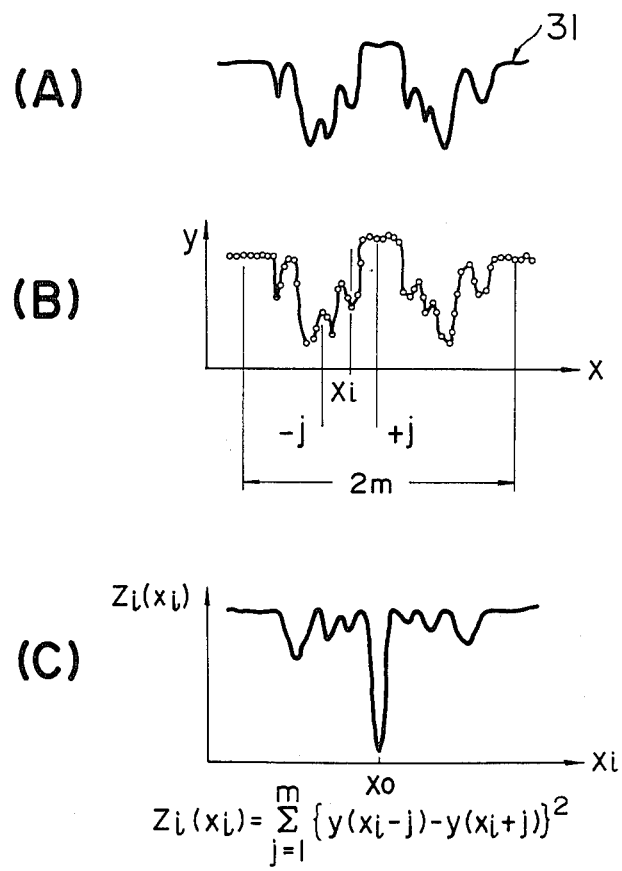
FIG. 4 is a set of waveform diagrams, (A) showing the video signal produced by the TV camera, (B) showing the signal processed by the sample-holding circuit, (C) showing the value of the logarithmic function calculated by the operational circuit.

The processing circuit 27 in FIG. 1A is shown in more detail in FIG. 3, in which a sample-holding circuit 30 operates in response to a video signal 31 as shown in FIG. 4(A) to sample the signal at a constant interval to sampling positions x1, x2, . . . , xn and hold the respective signal levels y1, y2, . . . , yn as shown in FIG. 4(B). A sampling signal generator 32 provides the sampling signal for the sample-holding circuit 30. An A/D converter 33 converts the analog signal held in the sample-holding circuit 30 into digital data. A memory 34 stores temporarily the digital data y1, y2, . . . , yn provided by the A/D converter 33. An operational circuit 35 calculates the symmetry function Zi(xi) given by the following equation (3) with respect to ±j sampling positions centered by point xi as a point of symmetry as shown in FIG. 4(B).

$$Zi(xi) = \sum_{j=1}^{m} \{y(xi - j) - y(xi + j)\}^2 \quad (3)$$

where m is a value determined optimally in consideration of the dimensions of the position alignment pattern in attention on the wafer 1 as shown in FIG. 4(B). The operational circuit 35 calculates the symmetry function Zi(xi) as shown in FIG. 4(C) by moving the symmetric point xi from x1 to x2 and up to xn, and detects a symmetric point xo which minimizes the function. The processing circuit 27 further includes an interface 54 for sending the alignment value from the operational circuit 35 to the motor driver shown in FIG. 1.

In summary, the processing circuit 27 operates such that the TV camera 25 transforms an image as shown in FIG. 2(B) into a video signal 31 shown in FIG. 4(A), the sample-holding circuit 30 takes samples of the video signal 31 at a constant interval, the A/D converter 33 converts held value y1, y2, . . . , yn into digital data y1, y2, . . . , yn, and the operational circuit 35 calculates the symmetry function Zi(xi) given by the equation (3) for ±j sampling positions centered by symmetric point xi, while moving the symmetric point from x1, x2, . . . , xn successively, as shown in FIG. 4(B), so as to find a symmetric point xo providing the minimum value of Zi(xi) as shown in FIG. 4(C). The symmetric point xo is the position of the most satisfactory symmetric pattern matching, and it indicates a true position of the position alignment pattern. The present invention allows concurrent focusing for the mask alignment pattern 19 and wafer alignment pattern 18, as described in connection with FIG. 2A, and therefore a double focal point can be realized using the single optical system.

Figure 5:
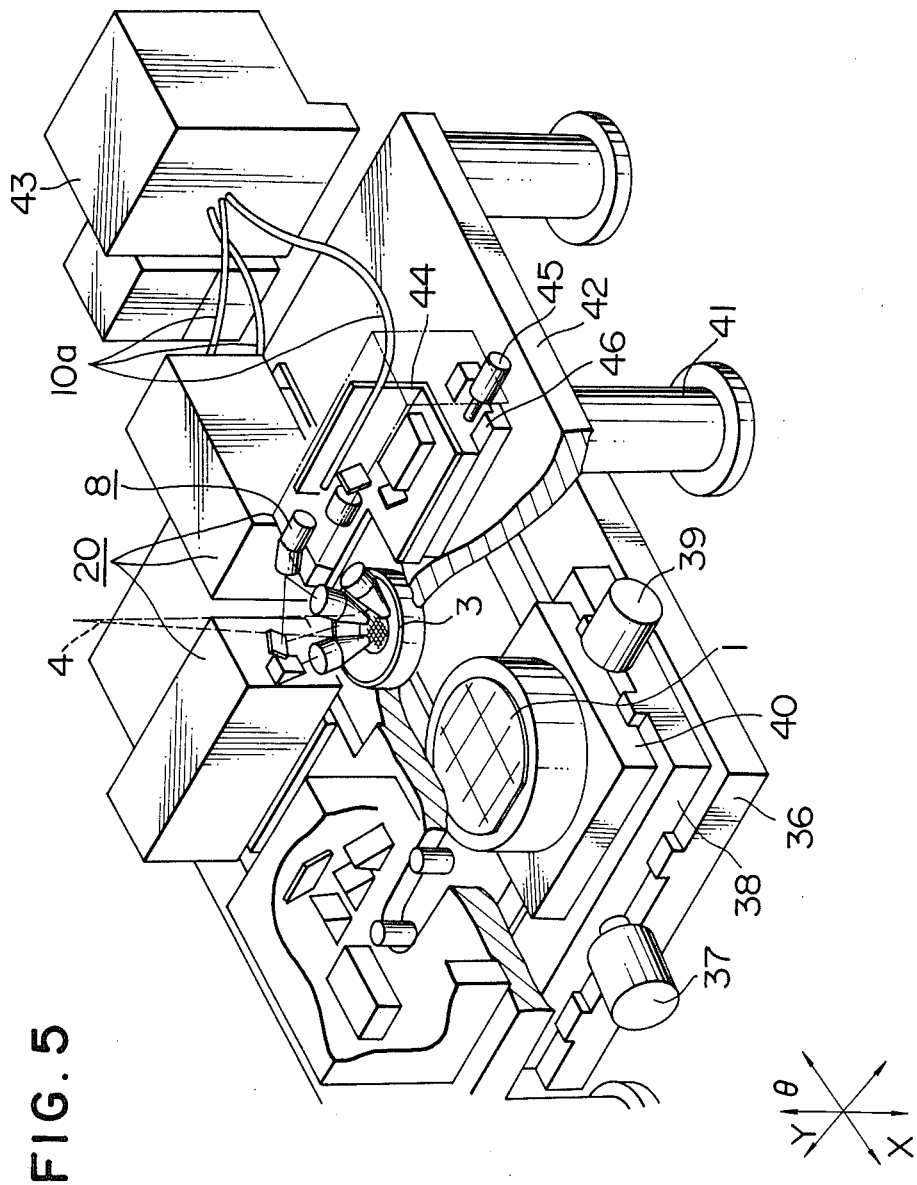
FIG. 5 is a perspective view of the apparatus for detecting the relative position of objects, to which this invention is applied.

FIG. 5 is a perspective view of the apparatus for detecting the relative position of objects according to an embodiment of this invention. In the figure, an X table 38 is supported on a base 36 so that it is moved in the X direction by an X-axis driving motor 37, a Y table 40 is supported on the X table 38 so that it is moved in the Y direction by a Y-axis driving motor 39, and the wafer 1 shown in FIG. 1 is mounted on the Y table 40. A platform 42 is fixed over the waver 1 by means of feet 41, and the aforementioned mask 3 is fixed on the platform 42 above the wafer 1. The aforementioned three sets of illumination optical systems 8 and three sets of detection optical systems 20 are disposed in a radial formation around the mask 3 on the platform 42, and the three sets of illunimation optical systems 8 are linked through respective fibers 10a to an Xe lamp house 43 which is supported independently of the platform 42. In this arrangement, the three sets of illumination optical systems 8 activated by the Xe lamp house 43 through the three fibers 10a operate to irradiate the mask 3 and wafer 1 concurrently, while at the same time the three sets of detection optical systems 20 operate to detect alignment errors between the wafer 1 and mask 3 in the X, Y and θ directions concurrently so as to move the X table 38 and Y table 40 in response to the detected alignment errors, thereby aligning the wafer 1 with the mask 3.

Figure 6:
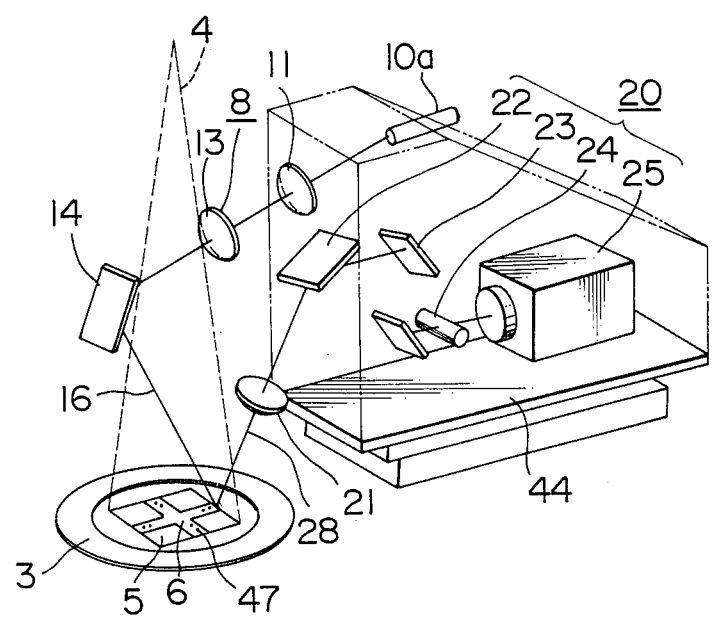
FIG. 6 is an enlarged perspective view of the illumination optical system and detection optical system shown in FIG. 5.

FIG. 6 is a perspective view showing in detail a set of the illumination optical system 8 and detection optical system 20 shown in FIG. 5. As shown in the figure, both the illumination optical system 8 and detection optical system 20 are supported on a common table 44, which is supported on a table 46 so that it is moved in the radial direction of the mask 3 by a driving motor 45, and the table 46 is supported fixedly on the platform 42 shown in FIG. 5. This arrangement allows both the illumination optical system 8 and detection optical system 20 to move concurrently in the radial direction over the mask 3. The positioning operation can take place for the alignment pattern 47 for multiple sequential processes existing on the street 6 formed within the chip 5 on the mask 3. Moreover, the sequential positioning operation can take place for various sizes of the chip 5.

Figure 8A:
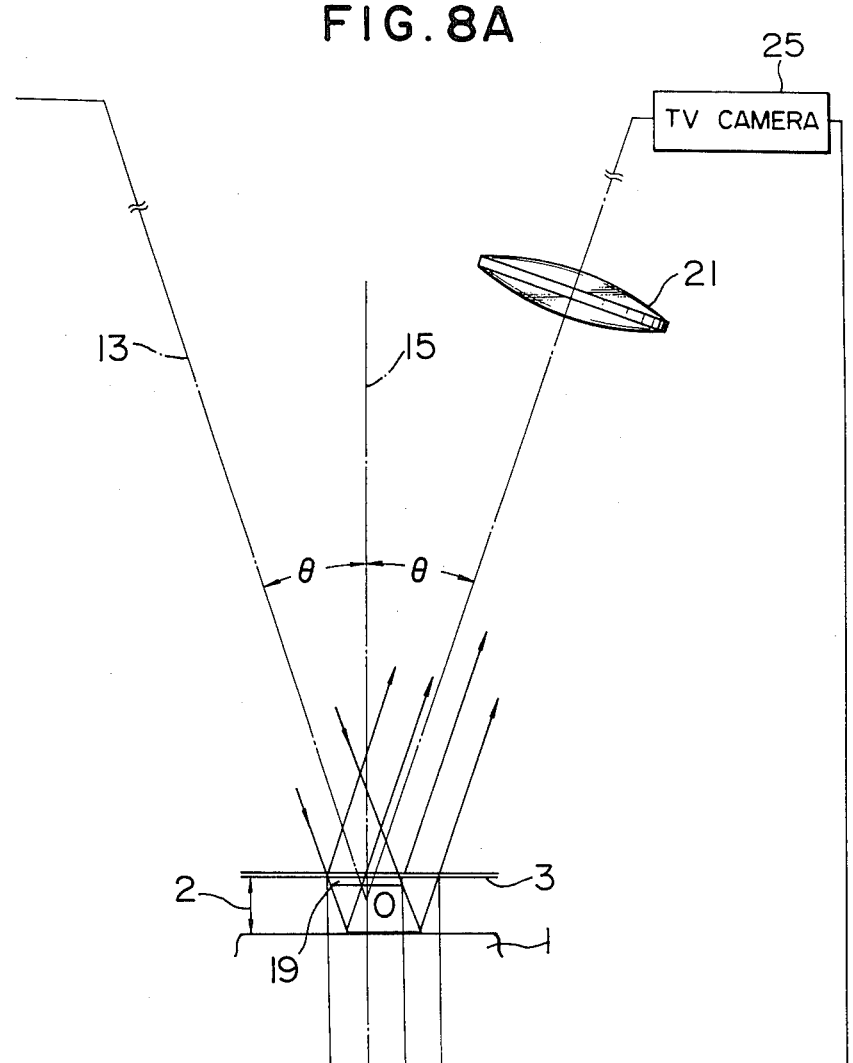
FIGS. 8A and 8B are diagrams used to explain the shadow of the mask alignment pattern created on the wafer alignment plane.
Figure 8B:
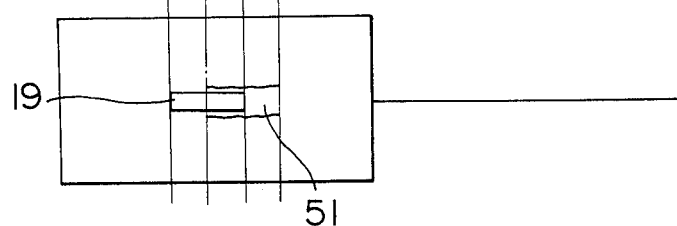
Figure 9A:
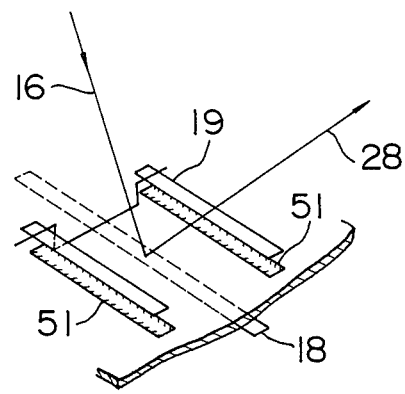
FIGS. 9A, 9B and 9C are diagrams showing the image input to the TV camera and the corresponding output signal.
Figure 9B:
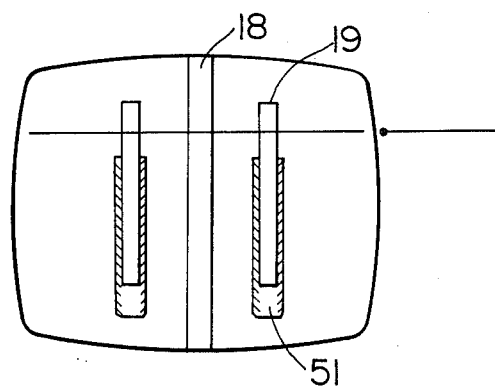
Figure 9C:
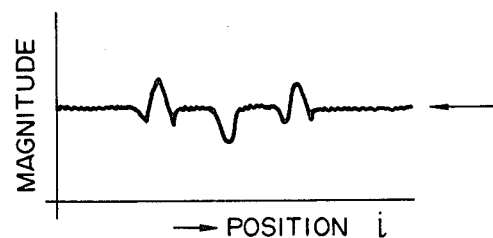

FIGS. 7(A) to 7(D) show embodiments of the detection pattern. In the figures, each of detection patterns 19a-19d is formed of many detection pattern segments 50 by the following reason. As shown in FIG. 8A, a wafer 1 and mask 3 are placed in parallel to each other with a spacing of 10 μm for example, and a mask pattern 19 on the lower surface of the mask 3 is illuminated by the light having an optical axis 13 inclined by angle θ with respect to the normal 15 which is at right angles with the alignment plane of the wafer 1 and mask 3, with the result of the creation of a shadow 51 of the mask pattern 19 on the wafer 1, as shown in FIG. 8B. When the mask pattern is shot by the TV camera 25 through the objective lens 21, the shadow 51 is created to surround part of the mask pattern 19, and in this state the center of the positioning pattern is obtained as shown in FIG. 4(C) by the processing circuit 27 shown in FIG. 3. On this account, in producing a video signal 31, as shown in FIG. 4(A), by the TV camera 25 from the image of the mask pattern 19 shown in FIG. 8B, the signal shown in FIG. 9C obtained from a distortion of the mask pattern 19 or signal noise in correspondence to a raster of the TV camera 25 shown in FIGS. 9A and 9B cannot provide accurate positional information in many cases.

Figure 10A:
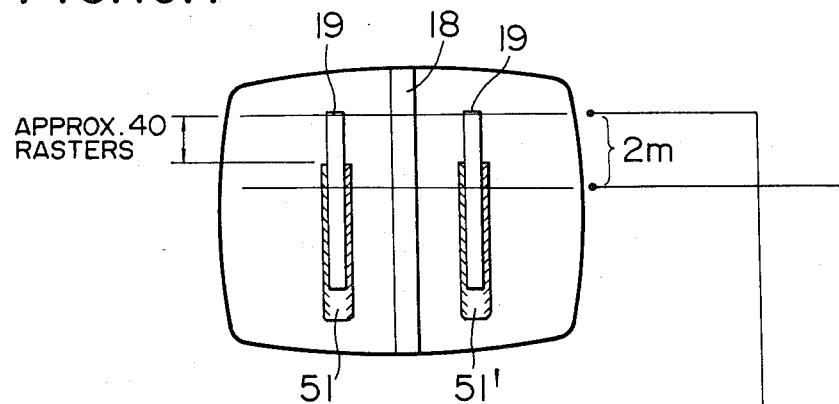
FIG. 10A is a diagram explaining the compression process for the image of the mask alignment pattern.
Figure 10B:
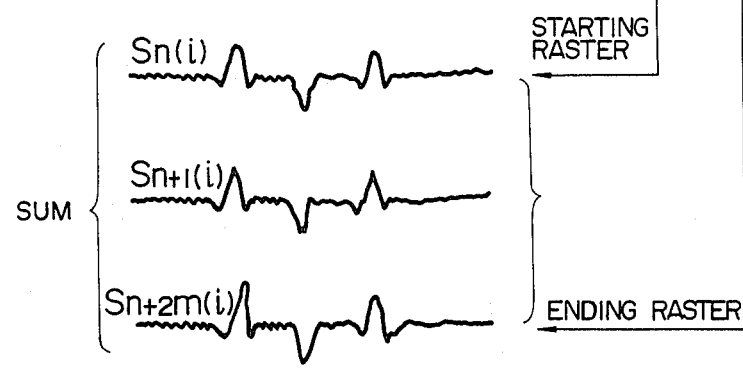
FIG. 10B is a diagram explaining the summation of the signals in section 2m shown in FIG. 10A.
Figure 10C:
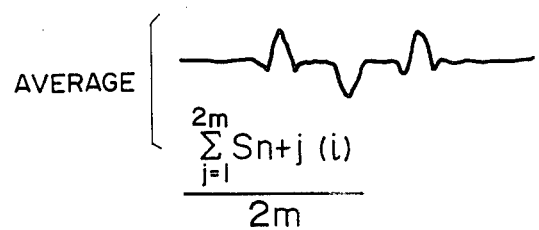
FIG. 10C is a diagram explaining the average signal.

An attempt was made for overcoming the problem caused by the above-mentioned shadow image by compressing the image of the mask pattern 19 on one raster of the TV camera 25 on an optical basis or by a signal processing technique. As shown in FIG. 10A, the TV camera 25 scans the image of the mask pattern 19 across a band of m rasters from raster position c to raster position d to produce a video signal, the sample-holding cirucit 30 in the processing circuit 27 shown in FIG. 3 samples the signal at a constant interval to hold signal levels y1, y2, ..., yn, the A/D converter 18 transforms the signal levels into digital data, the memory 34 stores temporality the digital data, the operational circuit 35 calculates the sum of the digital data as shown in FIG. 10B and calculates the mean value as shown in FIG. 10C, and finally the symmetric point porviding a minimum value is obtained.

In the above method, as will be appreciated from FIG. 10A, the TV camera 25 shoots the mask pattern 19 and shadow image 51 concurrently during the scanning of the m-raster band, and therefore the accuracy of detecting the position of the mask pattern 19 is deteriorated.

In detecting a wafer pattern, it is necessary to make the compression range wide due to the influence of the resist and the membrane of the mask, but in detecting the mask pattern, these influences are absent, allowing a relatively narrow compression range, and the required compression range 2 m is around 60 rasters (7.5 μm on the pattern) or more. In contrast, the portion without the shadow of mask pattern 19 is as small as 40 rasters (10 15 μm×tan θ=10-15 μm×tan 20°-=3-5 μm on the pattern), and this is a problem.

Figure 11A:
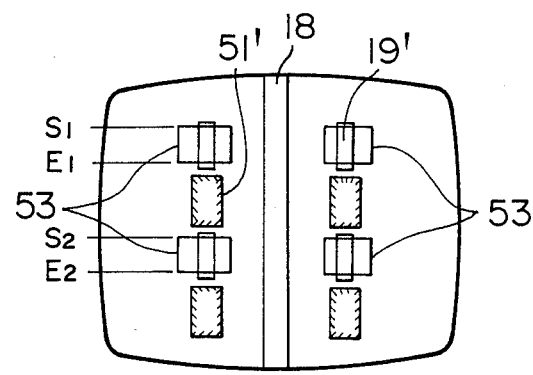
FIGS. 11A and 11B are diagrams showing the relationship between the mask alignment, the shadow image and the masking pickup position according to the separate embodiments of this invention.
Figure 11B:
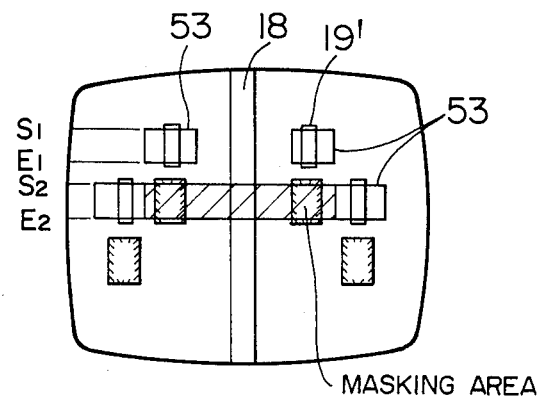

According to this invention, the mask pattern 19 is formed of a plurality of linear mask pattern segments 50 with a spacing 49 equal in dimension to the shadow image 51 so that images 19' and shadow images 51 are placed alternately as shown in FIG. 11A, thereby preventing the shadow image 51 from entering to the image of each mask pattern segment 50. Namely, the pattern entry area is restricted so that the influence of the shadow is avoided. For this, alignment detection is carried out manually or by means of the detection system and processing circuit 27 shown in FIG. 1 so that the mask pattern is included within a predetermined area 53 on the screen, and then positioning is carried out by activating a motor 52-1 using a driver 53-1.

Figure 16:
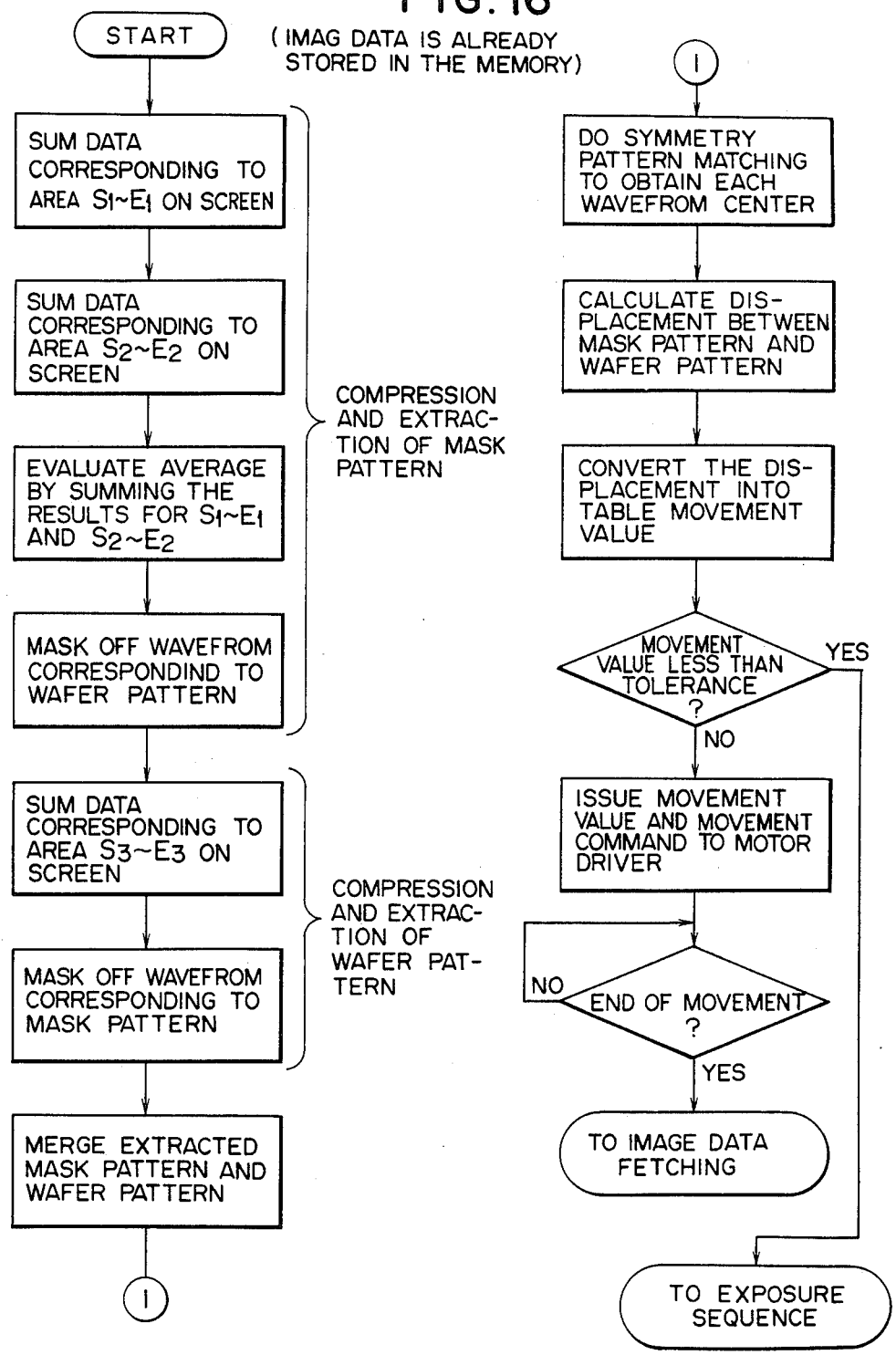
FIG. 16 is a flowchart showing the operational process implemented by the operational circuit shown in FIG. 3.

Subsequently, the operational circuit 35 implements the alignment process by following the procedure shown in FIG. 16. Initially, it is necessary to take a wide range of compression due to the influence of the resist and the membrane of the mask in detecting the wafer pattern, but these influences are absent in detecting the mask pattern and the compression range can be relatively narrow. Accordingly, for the detection of the mask pattern, the sum of the signals is calculated as shown in FIG. 12B for the predetermined areas S1-E1 and S2-E2 as shown in FIG. 12A in the same method as described in FIG. 10, the mean value is calculated as shown in FIG. 12C, and only the mask pattern is extracted by masking off the portion of the wafer pattern as shown in FIG. 12D.

Figure 13A:
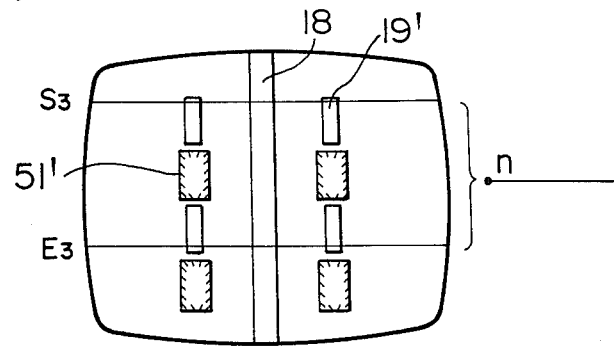
FIG. 13A a diagram showing the relationship between the wafer alignment pattern and the pickup position.
Figure 13B:
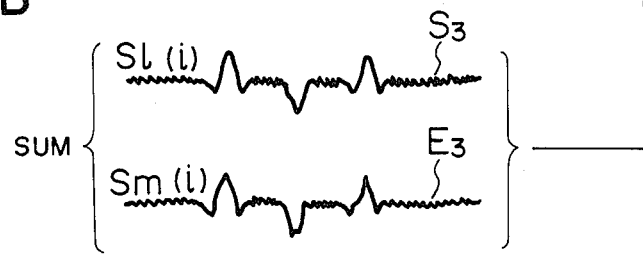
FIG. 13B is a diagram explaining the summation of the signals.
Figure 13C:
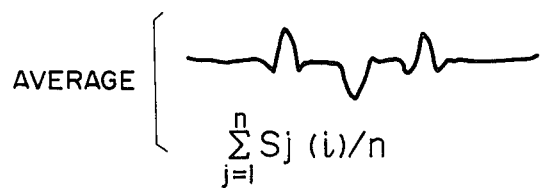
FIG. 13C is a diagram explaining the average signal.
Figure 13D:
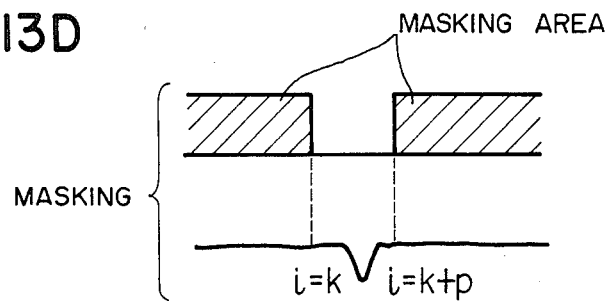
FIG. 13D is a diagram explaining the extraction of the wafer alignment pattern signal by masking.

Subsequently, for the detection of the wafer pattern which is generally similar to mask pattern detection, the sum of the signals is calculated as shown in FIG. 13B for the predetermined areas S3-E3 as shown in FIG. 13A by the same method described in FIG. 10, the mean value is calculated as shown in FIG. 13C, and only the wafer pattern is extracted by masking off the portion of the mask pattern as shown in FIG. 13D.

Figure 14:
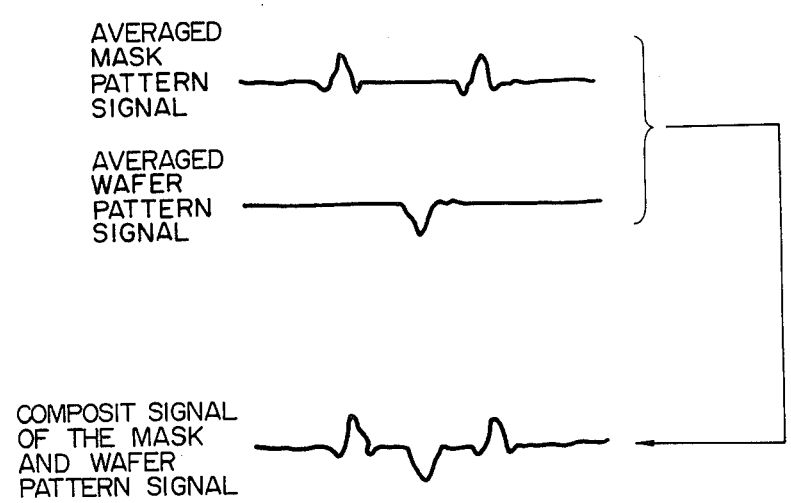
FIG. 14 is a diagram showing the signal produced by merging the signal shown in FIG. 12D and the signal shown in FIG. 13D.

Finally, by summing the signals obtained from FIG. 12D and FIG. 13D, as shown in FIG. 14, the accurate alignment pattern signal can be obtained, and the positional relationship of the mask and wafer can be detected accurately. Based on this detected data, the mask-pattern positioning operation is carried out by means of the driver 53 and motor 52 shown in FIG. 1.

Figure 7:
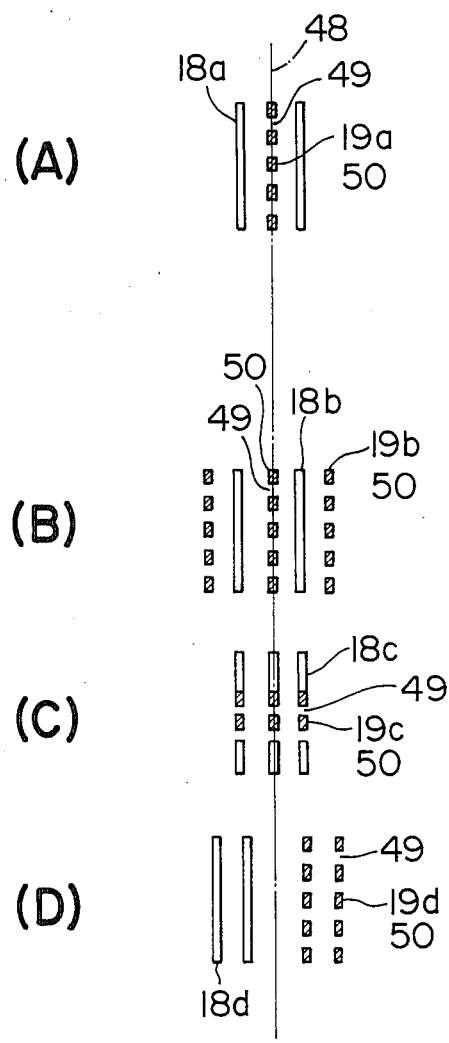
FIG. 7 is a set of diagrams showing detection patterns.

Besides the shapes of the alignment pattern shown in FIG. 1 through FIG. 6, there are other pattern shapes as shown in FIG. 7. FIG. 7(A) shows the case where a mask alignment pattern 19a in the form of a dashed line and two linear wafer alignment pattern 18a located symmetrically on both sides of 19a are arranged on and in parallel to the optical axis plane 48. FIG. 7(B) shows the case where a dashed-line mask alignment pattern 19b and two linear wafer alignment patterns and three mask alignment patterns 19b located alternately and symmetrically on both sides of 19b are arranged on and in parallel to the optical axis plane 48. FIG. 7(C) shows the case where a linear wafer alignment pattern 18c and two sets of linear wafer alignment patterns 18c located symmetrically on both sides of the first-mentioned 18c are arranged, with three dashed-line mask alignment patterns 19c having a smaller dimension in the longitudinal direction of the optical axis plane 48 being disposed in the central portion of the above three sets of wafer alignment patterns 18c, are arranged on and in parallel to the optical axis plane 48. FIG. 7(D) shows the case where linear wafer alignment patterns 18d and dashed-line mask alignment patterns 19g and 19h are arranged in parallel to the optical axis on the optical axis plane 48.

FIG. 7(E) shows the case where a dashed-line mask alignment pattern 19e and two linear wafer alignment patterns 18e located oblique and symmetrically with respect to the optical axis plane 48 on both sides of 19e are arranged on and in parallel to the optical axis plane 48.

As will be appreciated from the above figures, the inventive method is capable of alignment detection provided that patterns are arranged symmetrically with respect to the plane parallel to the optical axis plane 48 (i.e., the plane at right angles with the drawing). The optical axis plane 48 may have a parallel displacement within the figure. The reason is that for the case of a plane in other direction than mentioned above, the foregoing inventive method, which implements detection in a direction inclined with respect to the alignment plane, is incapable of accurate alignment detection due to the occurrence of asymmetry for planes other than that in parallel to the optical axis plane 46.

Figure 15A:
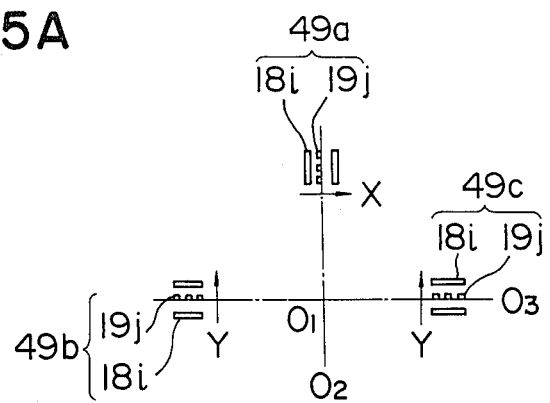
FIGS. 15A to 15C a set of diagrams showing the alignment pattern detection directions.
Figure 15B:
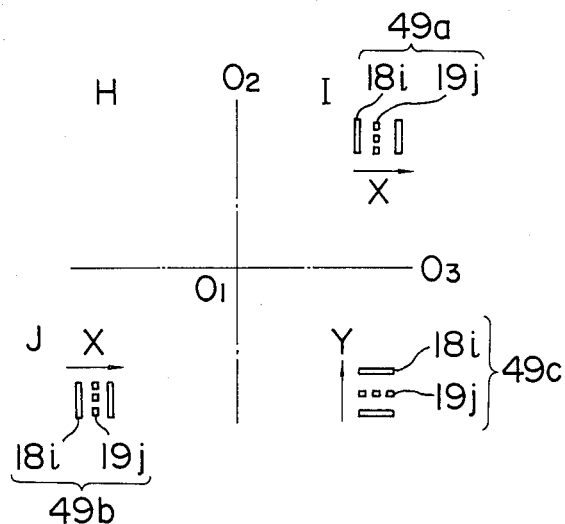
Figure 15C:
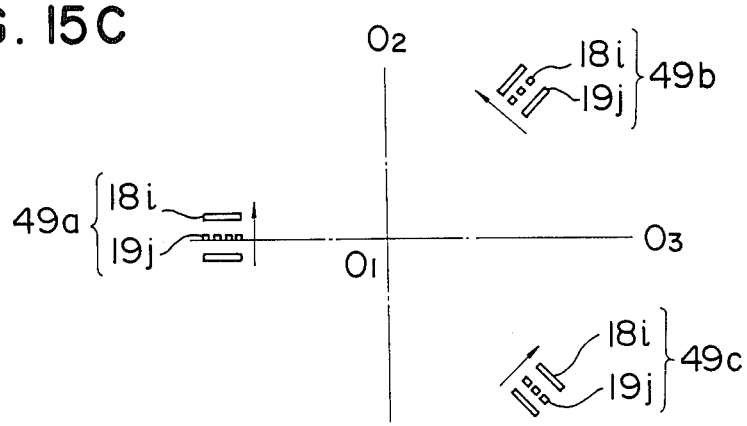

FIGS. 15A through 15C show the directions of detection for three sets of alignment patterns 49a, 49b and 49c, each set made up of a central mask alingment pattern 19j and two wafer alignment patterns 18i located symmetrically on both sides of 19j. FIG. 15A shows the case where a set of alignment patterns 49a are placed on a center line $O_2$ in the Y direction so that a mask alignment pattern 19j and two wafer alignment patterns 18i are arranged in the X direction and other two sets of alignment patterns 49b and 49c each including a mask alignment pattern 19j and two wafer alignment patterns 18i are placed on a center line $O_3$ in the X direction, with the distance of these sets of alignment patterns from the center $O_1$ of the wafer 1 and mask 3 being made equal. FIG. 10B shows the case where among four planes H, I, J and K partitioned by a center line $O_3$ in the X direction and a center line $O_2$ in the Y direction both passing through the center $O_1$ of the wafer 1 and mask 3, three sets of alignment patterns 49a, 49b and 49c are placed on the planes I, J and K, respectively, so that a mask alignment pattern 19i and two wafer alignment patterns 18i are arranged in the X direction for each of the alignment pattern sets 49a and 49b placed on planes I and J, and a mask alignment pattern 19i and two wafer alignment patterns 18i are arranged in the Y direction for the alignment pattern set 49c placed on plane K. FIG. 10C shows the case where three sets of alignment patterns 49a, 49b and 49c are placed radially with respect to the center $O_1$, so that a mask alignment pattern 10i and two wafer alignment patterns 18i are arranged in the Y direction for the alignment pattern set 49a, and a mask alignment pattern 19i and two wafer alignment patterns 18i are arranged in the oblique direction for each of the alignment pattern sets 49b and 49c. In any case, arrangement may be made so that three-dimensional detection is implemented using three sets of alignment patterns.

When each illumination optical system has its optical axis provided symmetrically against the optical axis of the detection optical system, the dark field illumination, illumination from the objective lens, or combination of these may be employed. Although in the foregoing embodiment the X-ray beam is used for the exposure light, the present invention is not confined to this, but a corpuscular beam or white light beam can also be used. It is not necessary to place an alignment pattern exclusively, but an image created in proximity to the wafer and mask can be used. The objective lens is preferably one having NA of below 0.4, and the inclination of the detection optical axis is preferably smaller than 70°.

The foregoing present invention has the following advantages.

(1) For the detection of alignment pattern in or near the exposure area:

(i) The conventional system, in which the optical system is moved at each alignment of exposure area, has necessitated the accuracy of movement of the order of μm and at least two seconds of time for the movement in a limited space between the mask plane and exposure light source, which amounts to about four seconds for setting and retraction. Therefore, the cyclic operation of four seconds including exposure, detection, positioning and movement for each piece of wafer has taken a considerable length of time. In contrast, the inventive method does not necessitate the movement of the optical system, whereby the throughput can be improved.

(ii) Alignment can immediately be followed by exposure, or alignment can take place during exposure, which prevents the deterioration of accuracy (about 0.05 μm) caused by the time lag (about two seconds) after alignment until exposure.

(iii) The conventional system has necessitated a mechanism for moving the optical system for each exposure area, resulting in a complex structure and a degraded accuracy due to the movement of optical component parts such as the lens system. In contrast, the inventive system does not need to move the optical system, whereby the structure is made simple and the accuracy can be improved.

(2) For detection of alignment pattern outside of the exposure area:

(i) The exposure area and the detection position can be made coincident or close to each other, which prevents the alignment error caused by the dimensional error (ranging up to 0.05 μm) due to the location of the mask and wafer.

(ii) The yield of chips in the peripheral section of a wafer can be improved.

(3) The alignment pattern optical system inclined at a certain angle against the plane at right angles with the alignment planes of multiple objects creates the shadow of the alignment pattern at a position displaced from the alignment pattern position, and this is used to detect the alignment positions of the multiple objects from the alignment pattern which is not affected by the shadow, whereby accurate positional detection is achieved, with ultimate effectiveness of the improved alignment accuracy, higher density integration and improved yield of semiconductor circuits.

(4) Based on the above items (1) to (3), the structure of the apparatus is simplified and accurate positional detection can be accomplished.

We claim:

1. A method of alignment comprising the steps of:
preparing a mask which has a symmetrical formation of an alignment pattern made up of a plurality of linear segments formed in a peripheral section of said mask, and a wafer which has a formation of an alignment pattern formed in a same direction as of the alignment pattern of said mask and made up of linear segments;
illuminating said mask alignment pattern along a direction inclined to said alignment direction using an illumination means;

imaging said mask alignment pattern and said wafer alignment pattern using an imaging means and transforming the image into a video signal;

converting the video signal into a digital signal using an A/D conversion circuit and storing the digital signal in a memory;

reading out the digital video signal from said memory, and averaging the digital video signal in a mask alignment pattern area by removing a shadow portion caused by said mask alignment pattern, and further averaging the digital video signal in a wafer alignment pattern area;

detecting a relative displacement between the mask and wafer from the averaged mask alignment pattern signal detected and averaged wafer alignment pattern signal detected; and aligning the mask and wafer by moving one of the mask and wafer so that the displacement between both members does not exist.

2. An apparatus for alignment comprising:

a mask which has a formation of an alignment pattern made up of at least one linear segment formed in a peripheral section of said mask;

a wafer which has a formation of an alignment pattern formed in a same direction as the alignment pattern of said mask and made up of linear segments;

illuminating means for illuminating a light to said mask alignment pattern along a direction inclined to an alignment direction;

imaging means for imaging said mask alignment pattern and said wafer alignment pattern and transforming the image into a video signal;

A/D conversion means for converting the video signal into a digital signal and for storing the digital signal in a memory;

averaging means for reading out the digital video signal from said memory and for averaging the digital video signal in a mask alignment pattern area by removing a shadow portion caused by said mask alignment pattern so as to provide an averaged wafer alignmemt pattern signal, and further for averaging the digital video signal in a wafer alignment pattern area so as to provide an averaged wafer alignment signal;

detecting means for detecting relative displacement between the mask and the wafer from the averaged mask alignment pattern signal and the averaged wafer alignment pattern signal; and aligning means for aligning the mask and the wafer by moving at least one of the mask and the wafer so that displacement between the mask and the wafer does not exist.

3. An alignment apparatus according to claim 2, wherein said averaging means comprises masking means for removing the shadow portion by masking for a digital video signal of the shadow portion in the digital video signal of the mask alignment pattern area in accordance with positional coordinates and summing means for averaging by summing each of the digital video signals.

4. An alignment apparatus according to claim 3, wherein said masking means is arranged such that the mask alignment pattern imaged by said imaging means is positioned to predetermined coordinates by finely moving a mask table for holding the mask.

5. An alignment apparatus according to claim 3, wherein said aligning means comprises an X-ray exposure system.

* * * * *